(12) United States Patent
Jang (10) Patent No.: US 8,421,127 B2
(45) Date of Patent: Apr. 16, 2013

(54) SEMICONDUCTOR DEVICE AND METHOD FOR FABRICATING THE SAME

(75) Inventor: Wen-Yueh Jang, Hsinchu (TW)

(73) Assignee: Windbond Electronics Corp., Taichung (TW)

( * ) Notice: Subject to any disclaimer, the term of this patent is extended or adjusted under 35 U.S.C. 154(b) by 39 days.

(21) Appl. No.: 13/183,442

(22) Filed: Jul. 15, 2011

(65) Prior Publication Data
US 2013/0015508 A1 Jan. 17, 2013

(51) Int. Cl.
*H01L 29/808* (2006.01)
*H01L 21/337* (2006.01)

(52) U.S. Cl.
USPC ........... 257/272; 257/445; 257/273; 257/256; 257/E29.312; 257/E21.445; 438/190; 438/269; 438/186

(58) Field of Classification Search ................... 257/272, 257/E29.312, E21.445, 273, 256, 408, 314; 438/190, 269, 186
See application file for complete search history.

(56) References Cited

U.S. PATENT DOCUMENTS

| 7,989,284 B2 * | 8/2011 | Choi ............................. 438/239 |
| 2001/0054734 A1 * | 12/2001 | Koh et al. ...................... 257/311 |
| 2010/0006816 A1 | 1/2010 | Magistretti et al. |
| 2012/0119288 A1 * | 5/2012 | Hozumi et al. ............... 257/329 |

\* cited by examiner

*Primary Examiner* — Cathy N Lam
(74) *Attorney, Agent, or Firm* — Jianq Chyun IP Office (57) ABSTRACT

A semiconductor device and a method for fabricating the same are described. The semiconductor device includes a well of a first conductive type, first doped regions of a second conductive type, gates of the second conductive type, second doped regions of the first conductive type, and isolation structures. The well is disposed in a substrate. The first doped regions are disposed in the well. The first doped regions are arranged in parallel and extend along a first direction. The gates are disposed on the substrate. The gates are arranged in parallel and extend along a second direction different from the first direction. One of the first doped regions is electrically connected to one of the gates. Each of the second doped regions is disposed in the first doped regions between two adjacent gates. Each of the isolation structures is disposed in the substrate between two adjacent first doped regions.

9 Claims, 9 Drawing Sheets

SEMICONDUCTOR DEVICE AND METHOD FOR FABRICATING THE SAME

BACKGROUND OF THE INVENTION

1. Field of the Invention

The present invention generally relates to a semiconductor device and a fabricating method thereof, and in particular, to a semiconductor device including a bipolar junction transistor (BJT) and a fabricating method thereof.

2. Description of Related Art

In general, when a memory device requiring high current is driven by a metal-oxide-semiconductor field effect transistor (MOSFET), the MOSFET usually has large size to provide enough driving capability, thereby increasing the layout area of the device. As the demand for device integrity is raised, the MOSFET in shrinking size cannot provide the memory device with high current, which results in a great impact on operation speed and performance of the device.

SUMMARY OF THE INVENTION

Accordingly, the present invention is directed to a semiconductor device and a method for fabricating the same, in which the device may have high driving capability in a relatively compact layout design.

A semiconductor device of the present invention is provided, including a well of a first conductive type, a plurality of first doped regions of a second conductive type, a plurality of gates of the second conductive type, a plurality of second doped regions of the first conductive type, and a plurality of isolation structures. The well is disposed in a substrate. The first doped regions are disposed in the well. The first doped regions are arranged in parallel and extend along a first direction. The gates are disposed on the substrate. The gates are arranged in parallel and extend along a second direction different from the first direction. One of the first doped regions is electrically connected to one of the gates. Each of the second doped regions is disposed in the first doped regions between two adjacent gates. Each of the isolation structures is disposed in the substrate between two adjacent first doped regions.

A method for fabricating a semiconductor device of the present invention is provided as follows. A plurality of isolation structures is formed in a substrate. The isolation structures are arranged in parallel and extend along a first direction. A well of a first conductive type is formed in the substrate. A plurality of first doped regions of a second conductive type is formed in the well. Each of the first doped regions is formed between two adjacent isolation structures. A plurality of gates of the second conductive type is formed on the substrate. The gates are arranged in parallel and extend along a second direction different from the first direction. One of the first doped regions is electrically connected to one of the gates. A plurality of second doped regions of the first conductive type is formed in the well. Each of the second doped regions is formed in the first doped regions between two adjacent gates.

As mentioned above, the semiconductor device and the fabricating method thereof of the present invention utilize the existing MOS process to form a vertical bipolar junction transistor (BJT) in the substrate, thereby minimizing dimensions of the device. In addition, by integrating the memory cells into the upside of the BJT, the BJT with high driving capability can provide higher current to the memory cells without increasing the device size. Hence, the integrity and performance of the device can be efficiently enhanced.

In order to make the aforementioned and other features and advantages of the present invention more comprehensible, preferred embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 5A to 8A are schematic cross-sectional diagrams of a method for fabricating a semiconductor device according to an embodiment of the present invention.

FIGS. 5B to 8B are schematic cross-sectional diagrams of a method for fabricating a semiconductor device according to an embodiment of the present invention.

DESCRIPTION OF THE EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Figure 1:
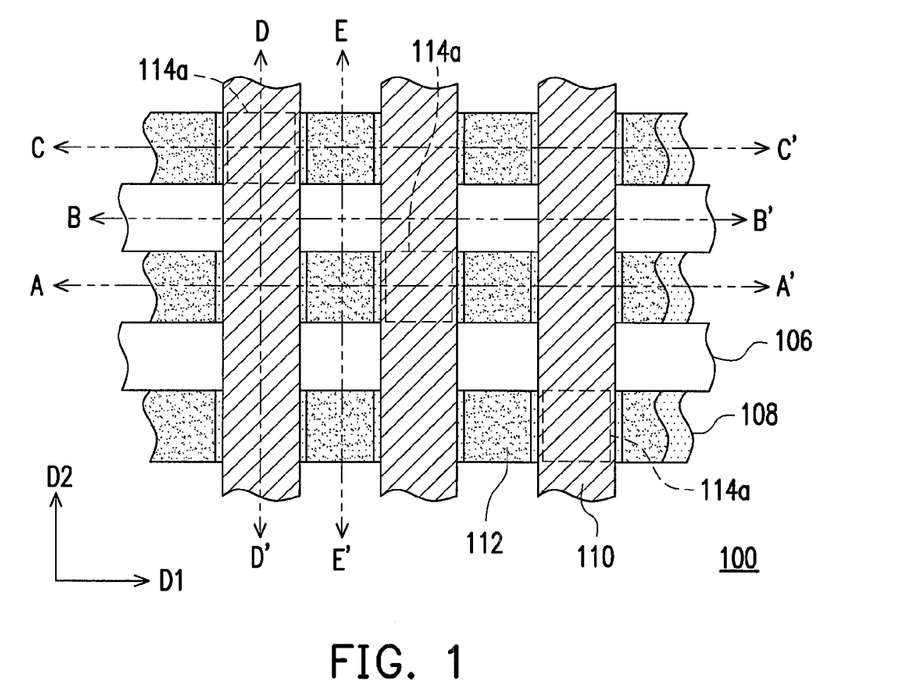
FIG. 1 depicts, in a top view, a layout of a semiconductor device according to an embodiment of the present invention.
Figure 2A:
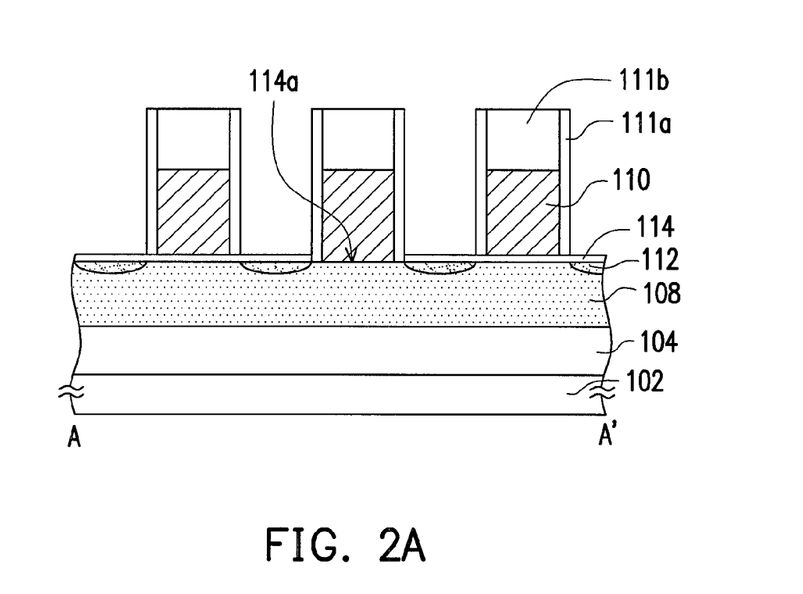
FIG. 2A is a schematic cross-sectional diagram of the structure shown in FIG. 1 along line A-A'.
Figure 2B:
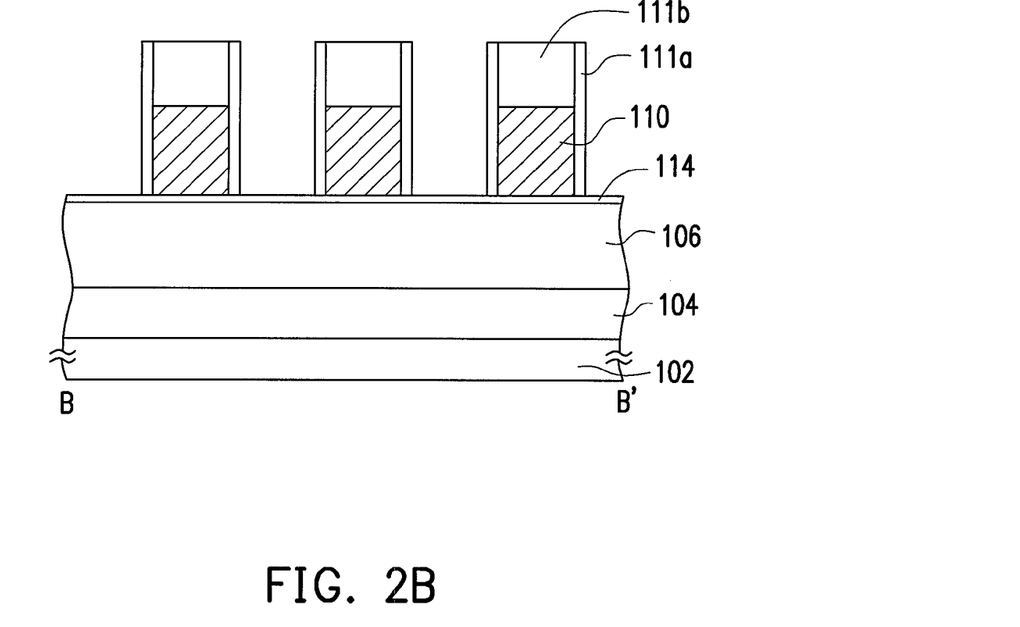
FIG. 2B is a schematic cross-sectional diagram of the structure shown in FIG. 1 along line B-B'.
Figure 2C:
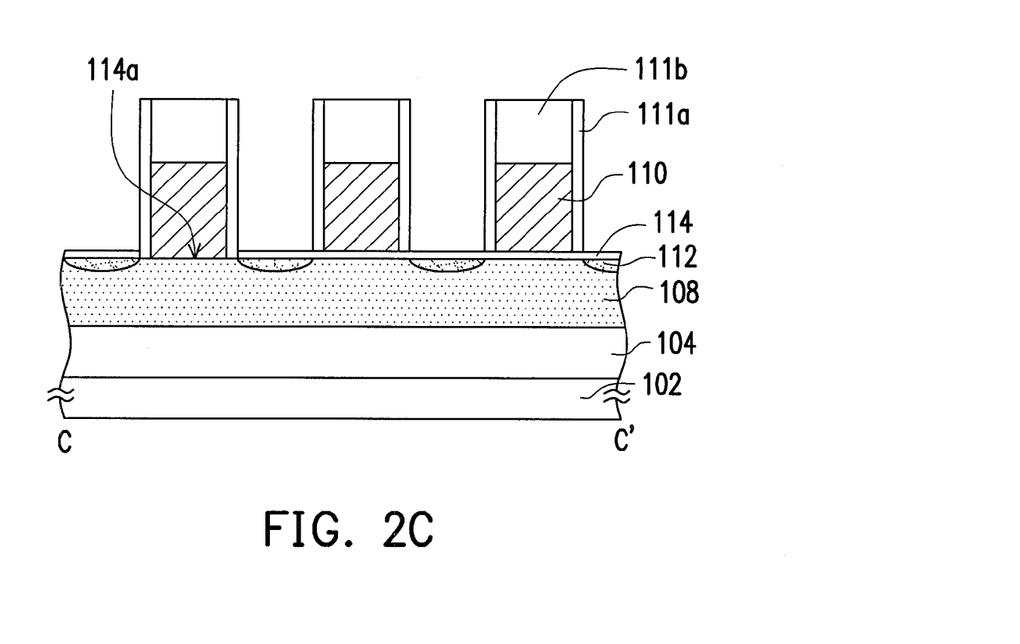
FIG. 2C is a schematic cross-sectional diagram of the structure shown in FIG. 1 along line C-C'.
Figure 2D:
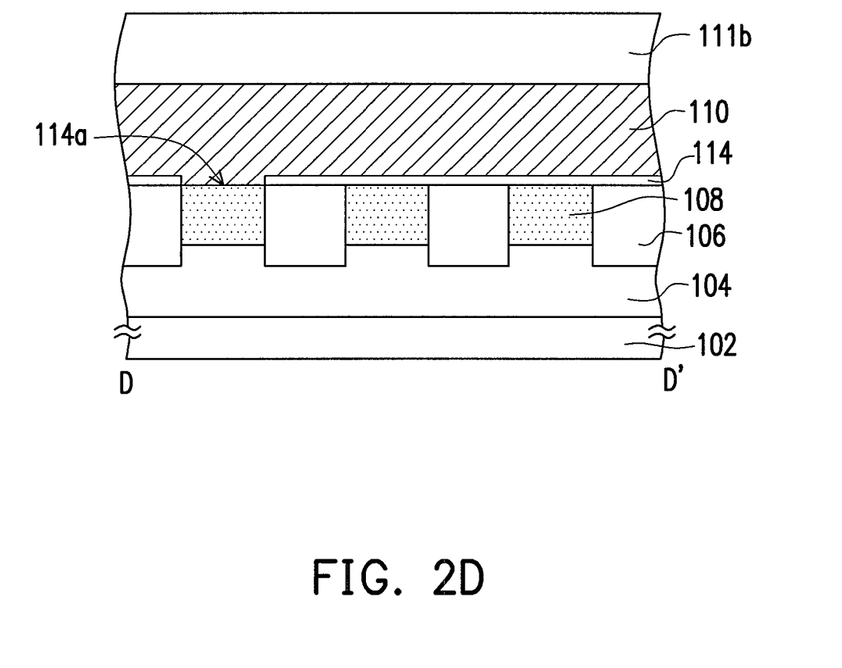
FIG. 2D is a schematic cross-sectional diagram of the structure shown in FIG. 1 along line D-D'.
Figure 2E:
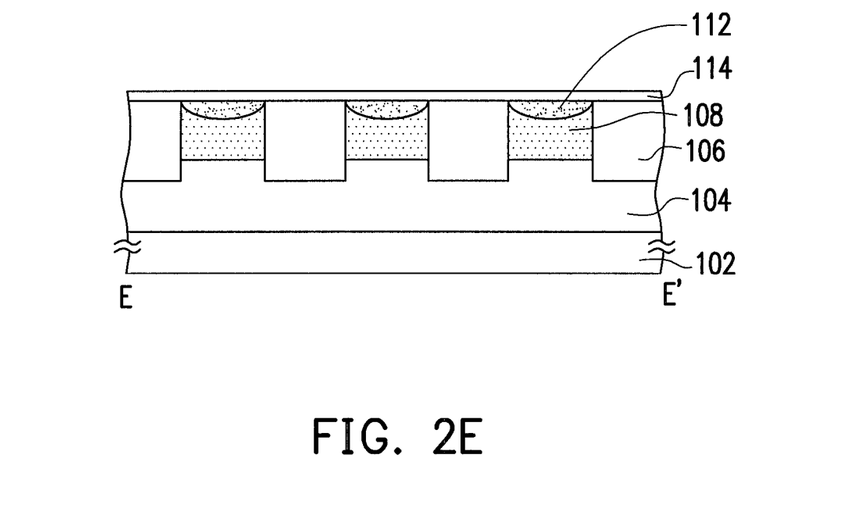
FIG. 2E is a schematic cross-sectional diagram of the structure shown in FIG. 1 along line E-E'.

FIG. 1 depicts, in a top view, a layout of a semiconductor device according to an embodiment of the present invention. In order to simplify the drawing for clear illustration, FIG. 1 is a schematic layout diagram of doped regions, gates and isolation structures. FIG. 2A is a schematic cross-sectional diagram of the structure shown in FIG. 1 along line A-A'. FIG. 2B is a schematic cross-sectional diagram of the structure shown in FIG. 1 along line B-B'. FIG. 2C is a schematic cross-sectional diagram of the structure shown in FIG. 1 along line C-C'. FIG. 2D is a schematic cross-sectional diagram of the structure shown in FIG. 1 along line D-D'. FIG. 2E is a schematic cross-sectional diagram of the structure shown in FIG. 1 along line E-E'.

Referring to FIG. 1 and FIGS. 2A to 2E, a semiconductor device 100 is, for example, a BJT. The semiconductor device 100 includes a well 104 of a first conductive type, a plurality of isolation structures 106, a plurality of first doped regions 108 of a second conductive type, a plurality of gates 110 of the second conductive type, and a plurality of second doped regions 112 of the first conductive type.

The well 104, e.g. a P-type well, is disposed in a substrate 102. The substrate 102 is a P-type or an N-type substrate, such as a Si substrate or other semiconductor substrates. In an embodiment, the doping concentration of the well 104 can be within a range of about $10^{15}/cm^2$ to $10^{17}/cm^2$.

The isolation structures 106 are disposed in the substrate 102. The isolation structures 106 arranged in parallel may extend along a first direction D1, thereby defining a plurality of active regions. The isolation structures 106 are, for example, shallow trench isolation (STI) structures.

The first doped regions 108, such as N-type doped regions, are disposed in the well 104. The first doped regions 108 are arranged in parallel and may extend along the first direction D1. Each first doped region 108 can be disposed in the well 104 located between two adjacent isolation structures 106. In other words, the isolation structures 106 and the first doped regions 108 are alternately arranged in the substrate 102. In addition, the depth of the isolation structures 106 is deeper than the depth of the first doped regions 108, so as to ensure two adjacent first doped regions 108 being isolated by the isolation structures 106. In an embodiment, the doping concentration of the first doped regions 108 may be within a range of about $10^{16}/cm^2$ to $10^{18}/cm^2$.

The gates 110, such as N+ gates, are disposed on the substrate 102. The gates 110 are arranged in parallel and may extend along a second direction D2 that is different from the first direction D1. Therefore, the gates 110 are crisscrossed with the first doped regions 108, so as to form a plurality of overlaps therebetween. It is important to mention that one of the first doped regions 108 is only electrically connected to one corresponding gate 110, and each of first doped regions 108 is electrically connected to the different gates 110. The materials of the gates 110 can be doped polysilicon or metal silicides. Although the gates 110 and the first doped regions 108 have the same conductive type, the doping concentration of the gates 110 is higher than that of the first doped regions 108. In an embodiment, the doping concentration of the gates 110 may be within a range of about $10^{19}/cm^2$ to $10^{21}/cm^2$.

In addition, spacers 111a and cap layers 111b can be optionally disposed around the gates 110 so as to protect the gates 110. The spacers 111a are disposed on both sidewalls of the gates 110, and the cap layers 111b are disposed on the top of the gates 110, respectively. The materials of the spacers 111a can be silicon oxides or silicon nitrides. The materials of the cap layers 111b can be silicon oxides or silicon nitrides.

The second doped regions 112, such as P+ doped regions, are disposed in the first doped regions 108 located between two adjacent gates 110. Specifically, the second doped regions 112 may be arranged along the layout of the first doped regions 108, and therefore disposed in the substrate 102 except the overlaps between the first doped regions 108 and the gates 110. In an embodiment, the concentration of the second doped regions 112 is, for example, within a range of about $10^{18}/cm^2$ to $10^{20}/cm^2$.

In an embodiment, the semiconductor device 100 may further include a dielectric layer 114 disposed on the substrate 102. The dielectric layer 114 has a plurality of openings 114a, and the openings 114a are disposed at a corresponding electrically connected junction of the first doped regions 108 and the gates 110. The openings 114a may be distributed at the overlaps between the first doped regions 108 and the gates 110 where electrical connections arise, such that the first doped regions 108 is capable of directly contacting the corresponding gates 110 to realize electrical connection. The materials of the dielectric layer 114 can be silicon oxides, silicon nitrides or materials with high dielectric constant (K value).

It is worthy to notice that, in the semiconductor device 100, the P-type well 104 may serve as a common collector, the N-type first doped regions 108 may serve as common bases, and the P+-type second doped regions 112 may serve as emitters. Therefore, this structure constitutes a vertical PNP-type BJT. Since the first doped regions 108 and the gates 110 have the same conductive type, and each of the first doped regions 108 can be electrically connected to the different gates 110 by direct contact through the openings 114a of the dielectric layer 114, each interface between the first doped regions 108 and the gates 110 at the openings 114a can function as a base contact. External circuits are able to apply bias to the corresponding first doped regions 108 through the gates 110.

Figure 3:
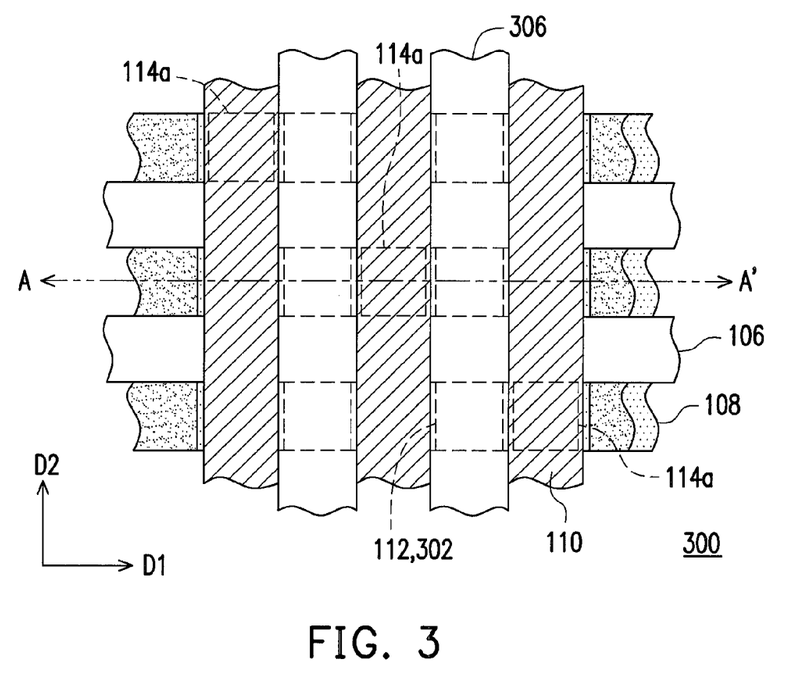
FIG. 3 depicts, in a top view, a layout of a semiconductor device according to another embodiment of the present invention.
Figure 4:
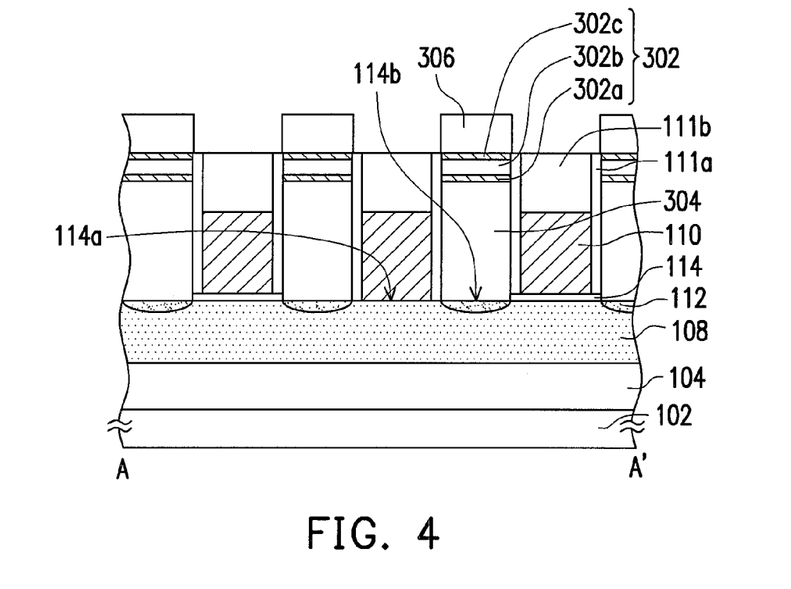
FIG. 4 is a schematic cross-sectional diagram of the structure shown in FIG. 3 along line A-A'.

Besides the embodiments of the semiconductor device mentioned above, the application of the foregoing BJT is also included in this invention. FIG. 3 depicts, in a top view, a layout of a semiconductor device according to another embodiment of the present invention. FIG. 4 is a schematic cross-sectional diagram of the structure shown in FIG. 3 along line A-A'. To simplify the drawing for clear illustration, a layout of the doped regions, the gates, memory cells and bit lines is mainly sketched out in FIG. 3. In FIG. 3 and FIG. 4, the same elements as shown in FIG. 1 and FIG. 2 are designated with the same reference numbers, and detailed descriptions of the same or like elements are omitted hereinafter.

Referring to FIG. 3 and FIG. 4, in this embodiment, the semiconductor device 300 is, for example, a structure combining the BJT with the memory. Besides the semiconductor device 100 shown in FIG. 1, the semiconductor device 300 further includes a plurality of memory cells 302, a plurality of conductive plugs 304, and a plurality of bit lines 306.

The memory cells 302 are disposed on the substrate 102, such as on the top of the BJT. The memory cells 302 are coupled to the corresponding second doped regions 112. The memory cells 302 are, for instant, resistive random access memory (RRAM) cells, phase change memory (PCM) cells or magnetoresistive random access memory (MRAM) cells, or other two-terminal memory cells. In details, each memory cell 302, in an embodiment, may include a lower electrode 302a, a variable resistance layer 302b and an upper electrode 302c. The materials of the lower electrodes 302a and the upper electrodes 302c can be individually metal or Si. The variable resistance layers 302b between the lower electrodes 302a and the upper electrodes 302c are, for example, layers which would change their phase at different temperatures or change their electrical resistivity under different conditions, and thereby form the stacking structure of metal/insulator/metal (MIM) together with the lower electrodes 302a and the upper electrodes 302c. The materials of the variable resistance layers 302b can be metal oxides such as $NiO_x$, $TiO_x$, $Nb_2O_5$, $Al_2O_3$, $Ta_2O_5$, $CuO_x$, $WO_x$, $CoO$; or Cr doped perovskite oxides such as $SrZrO_3$, $(Ba,Sr)TiO_3$, $SrTiO_3$; or Cu doped oxides such as $MoO_x$, $Al_2O_3$, $ZrO_2$; or Al doped oxides such as $ZnO$; or $Pr_{0.7}Ca_{0.3}MnO_3$ (PCMO) and so on.

The conductive plugs 304 are disposed between the memory cells 302 and the second doped regions 112. In an embodiment, the dielectric layer 114 can be provided with several openings 114b, disposed on the corresponding second doped regions 112, so that the conductive plugs 304 is capable of directly contacting with the corresponding second doped regions 112 to realize electrical connection. In other words, the lower electrodes 302a of the memory cells 302 are electrically connected with the second doped regions 112 through the conductive plugs 304. Accordingly, the current provided from the BJT may pass through the second doped regions 112 and the conductive plugs 304, and then arrive into the memory cells 302. The materials of the conductive plugs 304 can be W.

The bit lines 306, arranged in parallel, may extend along the second direction D2. Each bit line 306 is disposed on the memory cells 302 between two adjacent gates 110. The bit lines 306 can be electrically connected with the upper electrodes 302c of the memory cells 302 thereunder. Each bit line 306 may serially connect several underneath memory cells 302 along the second direction D2, such that the memory cells 302 can be controlled by the bit lines 306. The materials of the bit lines 306 can be Al. In this embodiment, besides serving as the base of the BJT, the first doped regions 108 can also function as word lines to control the memory cells 302.

It is worthy to mention that performance of the device can remain the same without increasing the device size by integrating the BJT capable of providing high driving current under the memory cells 302. The layout area of the semiconductor device can thus be minimized.

A process flow for fabricating the semiconductor device shown in FIG. 1 and FIGS. 2A to 2E is then illustrated with cross-sectional diagrams along respective lines A-A' and B-B' in FIG. 1. For illustration purposes, the following disclosure of semiconductor device manufacture is mainly described in terms of utilizing the MOS process to form the semiconductor device in this invention, which thereby enables those of ordinary skill in the art to practice this invention, but is not construed as limiting the scope of this invention. It is appreciated by those of ordinary skill in the art that other elements can be formed in a manner or in sequence not shown in the following embodiment according to known knowledge in the art.

FIGS. 5A to 8A and FIGS. 5B to 8B schematically depict, in a cross-sectional view, a fabricating method of a semiconductor device according to an embodiment in this invention. FIGS. 5A to 8A are schematic cross-sectional diagrams of the structure shown in FIG. 1 along line A-A'. FIGS. 5B to 8B are schematic cross-sectional diagrams of the structure shown in FIG. 1 along line B-B'.

Figure 5A:
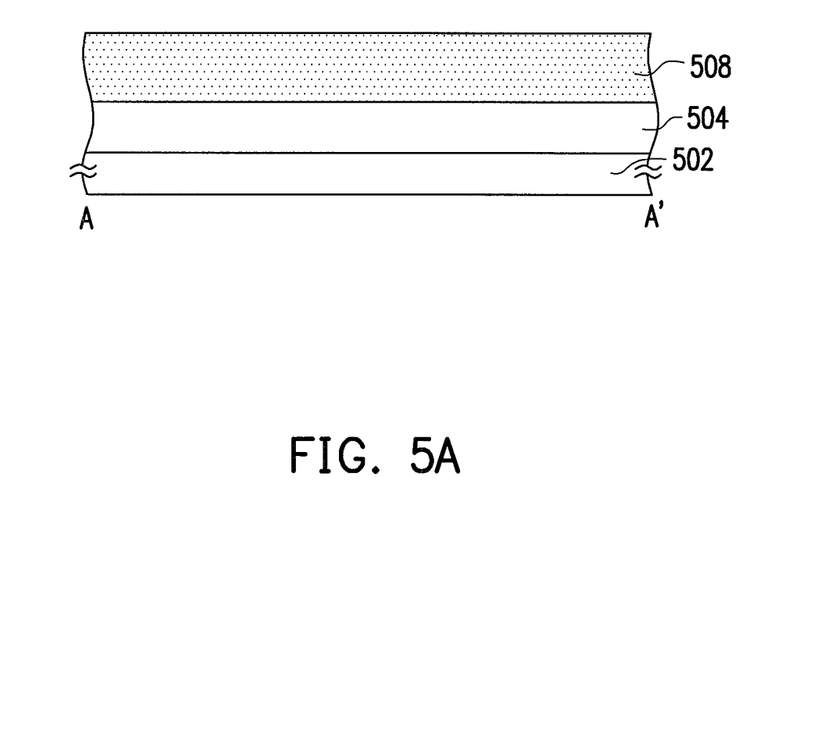
Figure 5B:
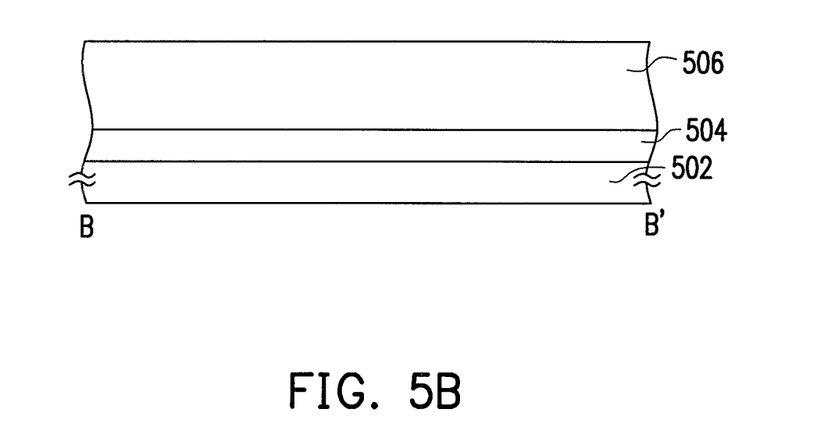

Referring to FIG. 5A and FIG. 5B, a substrate 502 of the first conductive type, such as P-type or N-type, is provided. A plurality of isolation structures 506 is formed in the substrate 502, and the isolation structures 506 arranged in parallel may extend along the first direction D1. The isolation structures 506 are, for example, shallow trench isolation (STI) structures. Then, a well 504 of the first conductive type, e.g. a P-type well, is formed in the substrate 502. In an embodiment, the dopant implanted into the well 504 can be B. The implantation energy is about 120 KeV to 300 KeV, and the doping concentration can be within a range of about $10^{12}/cm^2$ to $10^{13}/cm^2$.

Then, a plurality of first doped regions 508 of the second conductive type is formed in the well 504. The first doped regions 508, such as N-type doped regions, are formed between two adjacent isolation structures 506 respectively. The first doped regions 508, arranged in parallel, may extend along the first direction D1. The first doped regions 508 are formed, for example, by utilizing the isolation structures 506 as a mask and performing an ion implantation to the substrate 502, so that the self-aligned first doped regions 508 are formed in the substrate 502 exposed by the isolation structures 506. In an embodiment, the dopant used for the implantation of the first doped regions 508 may be P. The implantation energy is about 50 KeV to 180 KeV, and the doping concentration can be within a range of about $10^{13}/cm^2$ to $10^{14}/cm^2$. In addition, the doped depth of the first doped regions 508 is shallower than the depth of the isolation structures 506.

Figure 6A:
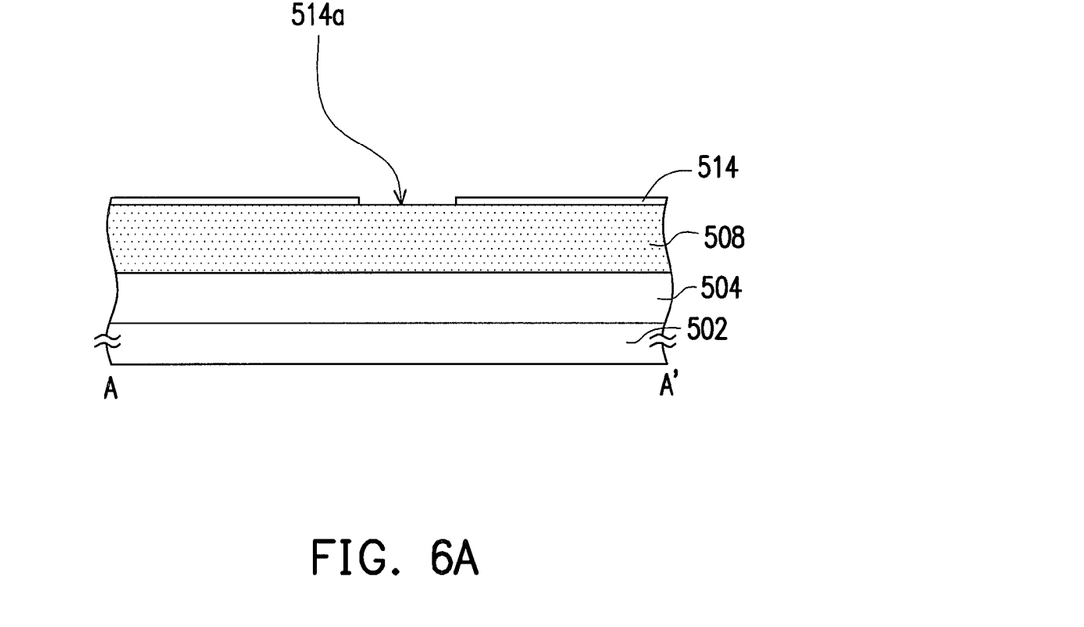
Figure 6B:
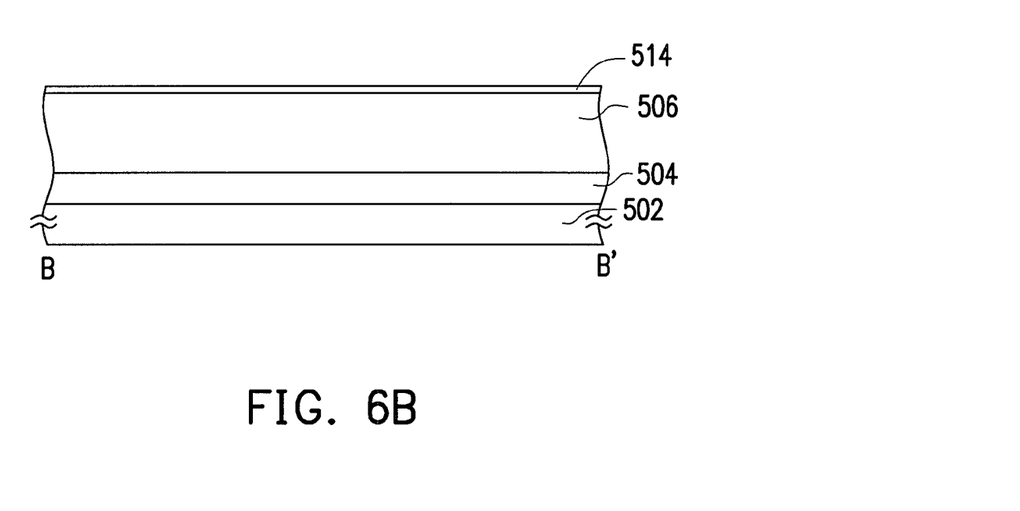

Referring to FIG. 6A and FIG. 6B, a dielectric layer 514 is formed on the substrate 502. The dielectric layer 514 is then patterned to remove a part of the dielectric layer 514, so as to form a plurality of openings 514a therein. The openings 514a may expose partial upside surface of each first doped region 508, and only one opening 514a is formed correspondingly on one of the first doped regions 508, for instant.

Figure 7A:
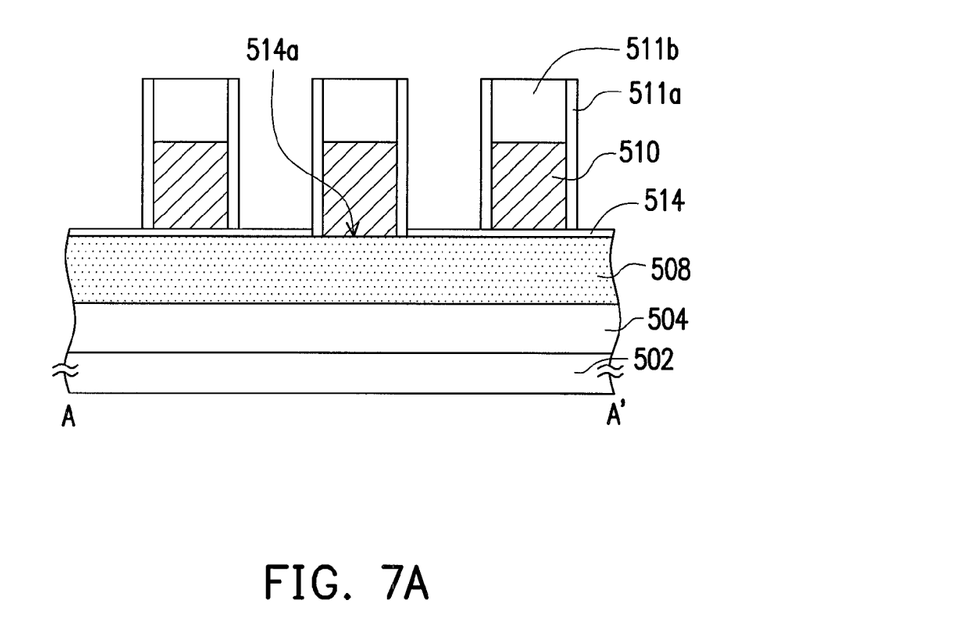
Figure 7B:
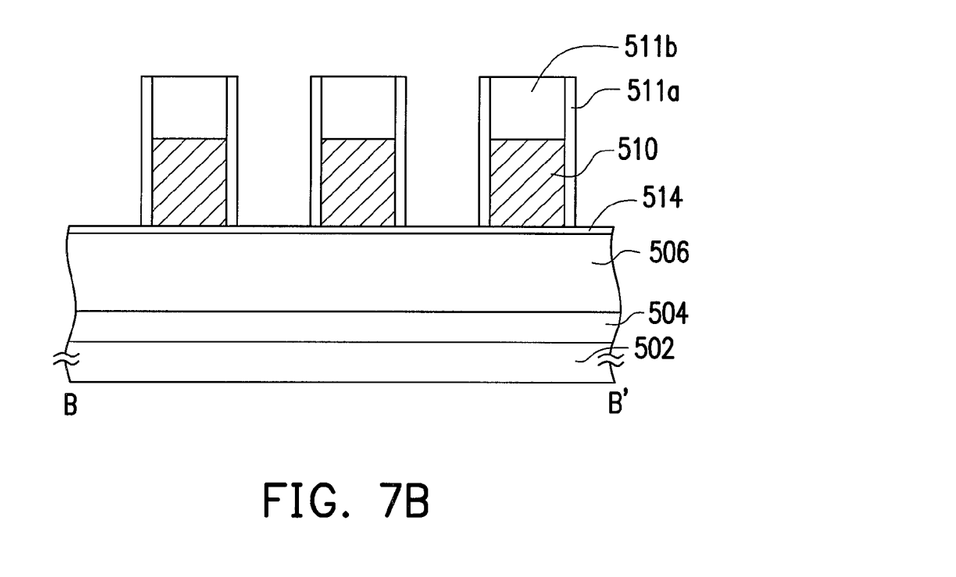

Referring to FIG. 7A and FIG. 7B, a plurality of gates 510 of the second conductive type is formed on the substrate 502. The gates 510, such as N+ gates, are arranged in parallel and extend along the second direction D2 that is different from the first direction D1. The gates 510 are formed, for example, by forming a conductive layer on the dielectric layer 514 and then pattering this conductive layer to obtain desirable patterns of the gates 510. Since the dielectric layer 514 has several openings 514a exposing partial upside surface of the first doped regions 508, the gates 510 formed on the dielectric layer 514 can directly contact the corresponding first doped regions 508 through the openings 514a, so as to realize electrical connection. Besides, one of the first doped regions 508 may be only electrically connected to one corresponding gate 510, and the first doped regions 508 are electrically connected to different gates 510 respectively. The materials of the gates 510 can be doped polysilicon or metal silicides. In an embodiment, the doping concentration of the gates 510 may be within a range of about $10^{19}/cm^2$ to $10^{21}/cm^2$, which is higher than the doping concentration of the first doped regions 508.

Afterward, spacers 511a can be optionally formed on the sidewalls of the gates 510, and cap layers 511b can be optionally formed on the top of the gates 510, so as to protect the periphery of the gates 510. The materials of the spacers 511a can be silicon oxides or silicon nitrides. The materials of the cap layers 511b can be silicon oxides or silicon nitrides.

Figure 8A:
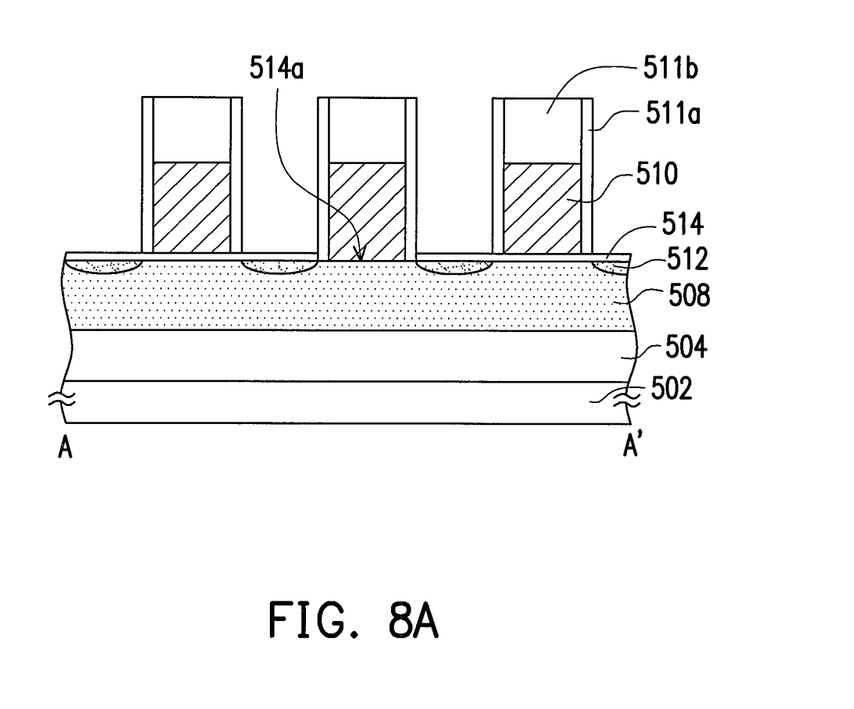
Figure 8B:
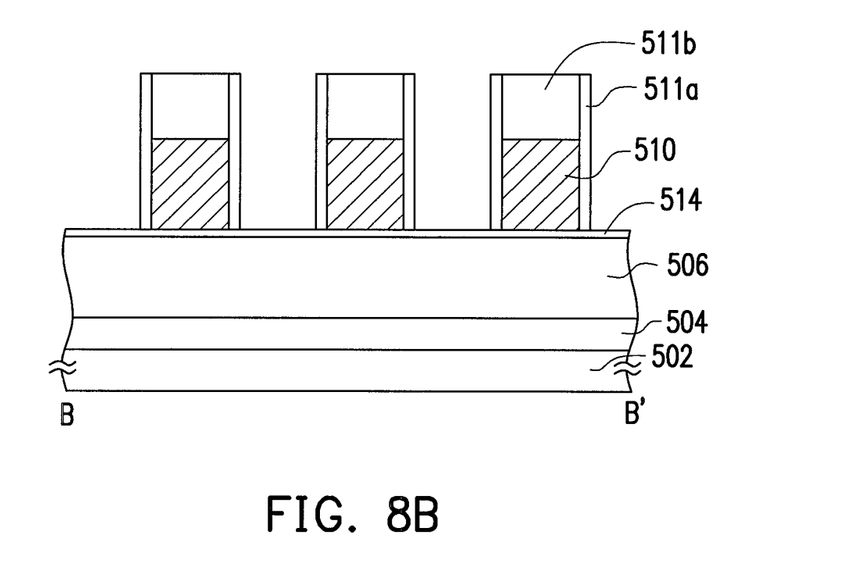

Referring to FIG. 8A and FIG. 8B, a plurality of second doped regions 512 of the first conductive type is formed in the well 504. The second doped regions 512, such as P+ doped regions, are formed in the first doped regions 508 between two adjacent gates 510 respectively. The second doped regions 512 are formed, for example, by using the gates 510 and their spacers 511a as a mask and performing an ion implantation to the substrate 502, so that the self-aligned second doped regions 512 are formed in the substrate 502 outside the spacers 511a. It should be noticed that the formation of the second doped regions 512 can be conducted simultaneously with formation of source and drain regions in the MOS process. In an embodiment, the dopant used for the implantation of the second doped regions 512 may be As. The implantation energy is about 10 KeV to 30 KeV, and the doping concentration can be within a range of about $10^{15}/cm^2$ to $10^{16}/cm^2$. So far, the PNP-type BJT structure (that is, semiconductor device 100) shown in FIG. 1 and FIGS. 2A to 2E is completed.

Figure 9:
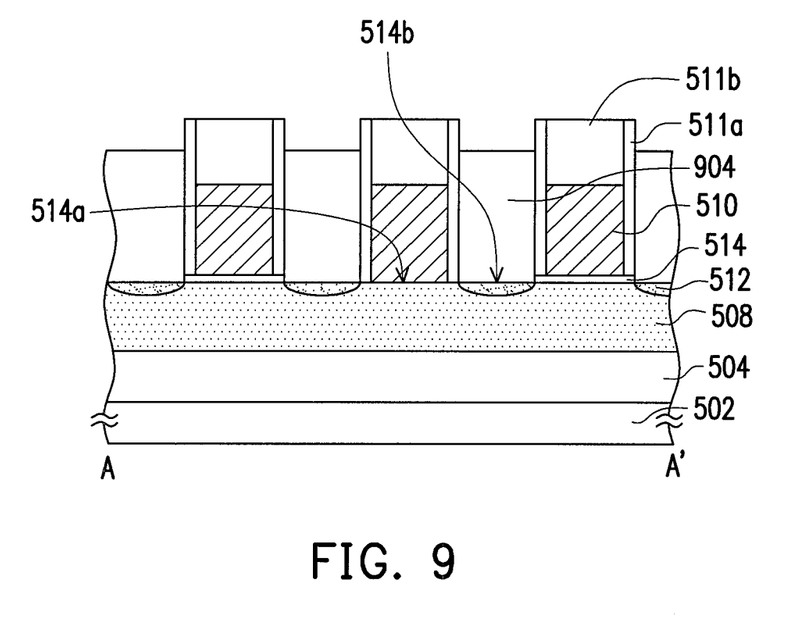
FIG. 9 and FIG. 10 are schematic cross-sectional diagrams of a method for fabricating a semiconductor device according to another embodiment of the present invention.
Figure 10:
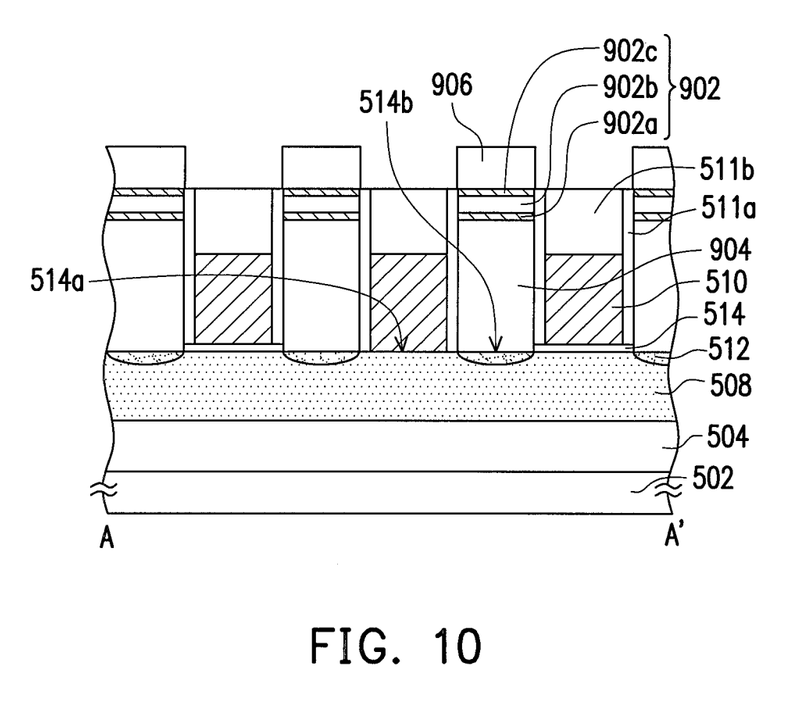

It is worthy to note that memory can be optionally formed on the BJT after the manufacture of the BJT. A process flow for fabricating the semiconductor device shown in FIG. 4 is then illustrated with cross-sectional diagrams along line A-A' in FIG. 3. FIG. 9 and FIG. 10 are schematic cross-sectional diagrams of a method for fabricating a semiconductor device according to another embodiment of the present invention. FIG. 9 and FIG. 10 are the cross-sectional diagrams illustrating the structure along line A-A' in FIG. 3, and mainly describe the process steps performed after FIG. 8A. The same elements contained therein are designated with the same reference numbers, and detailed descriptions of the same or like elements are omitted hereinafter.

Referring to FIG. 9, a plurality of openings 514b is formed in the dielectric layer 514 by removing the exposed dielectric layer 514. The openings 514b may expose the top surface of the second doped regions 512. Then, a plurality of conductive plugs 904 is formed on the exposed second doped regions 512, respectively. The materials of the conductive plugs 904 can be W.

Referring to FIG. 10, a plurality of memory cells 902 is formed on the substrate 502. The memory cells 902 may be formed on the corresponding conductive plugs 904, and therefore electrically coupled to the second doped regions 512 through the conductive plugs 904. The memory cells 902 are, for instant, resistive random access memory (RRAM) cells, phase change memory (PCM) cells or magnetoresistive random access memory (MRAM) cells, or other memory cells which may require higher driving current. In an embodiment, each memory cell 902 can include a lower electrode 902a, an upper electrode 902c, and a variable resistance layer 902b between the lower electrode 902a and the upper electrode 902c, thereby forming a stacking structure of metal/insulator/metal (MIM).

Afterward, a plurality of bit lines 906 is formed on the substrate 502, so as to complete the structure combining the BJT and the memory shown in FIG. 3 and FIG. 4 (that is, semiconductor device 300). Each bit line 906 is formed on the memory cells 902 between two adjacent gates 510 respectively, and thus, the bit lines 906, arranged in parallel, may extend along the second direction D2. Therefore, each bit line 906 can electrically connect the plurality of memory cells 902 thereunder along the second direction D2, so as to control the memory cells 902. The materials of the bit lines 906 can be Al.

It is noticed that the foregoing embodiments in which the first conductivity type is P-type and the second conductivity type is N-type are provided for exemplary illustration purposes, and should not be construed as limiting the scope of the present invention. It is appreciated by those skilled in the art that the conductivity type depicted above can be exchanged, i.e. the first conductivity type being N-type and the second conductivity type being P-type, so as to form the semiconductor device in other embodiments of this invention. Other applications and modifications should be apparent to those of ordinary skill in the art in accordance with the said embodiments, and thus, the detailed descriptions thereof are not specifically described herein.

In view of the above, the semiconductor device and the method for fabricating the same in this invention have at least following advantages:

1. The semiconductor device according to the foregoing embodiments includes, in the substrate, the well as the common collector, the first doped regions as the common bases, and the second doped regions as the emitters, so as to form the vertical type BJT. Since the gates can directly contact the corresponding first doped regions thereby serving as the base contacts, dimensions of the semiconductor device can be shrunk down to miniaturization. In addition, owing to the BJT with higher driving capability, the memory cells integrated with the BJT thereunder not only minimize the layout area, but also provide the memory cells with higher current, such that the performance of the device can be enhanced remarkably.

2. The fabricating method of the semiconductor device according to the foregoing embodiments can be widely applicable to many memory devices, and are able to integrate the BJT structure into the existing MOS process merely by increasing a few photomasks. The process is simple, and can also greatly upgrade the integrity of the memory device.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A semiconductor device, comprising:
a well of a first conductive type, disposed in a substrate;
a plurality of first doped regions of a second conductive type, disposed in the well, wherein the first doped regions extend along a first direction and are arranged in parallel;
a plurality of gates of the second conductive type, disposed on the substrate, wherein the gates extend along a second direction different from the first direction and are arranged in parallel, and one of the first doped regions is electrically connected to one of the gates;
a dielectric layer disposed on the substrate, wherein the dielectric layer has at least an opening correspondingly disposed at an electrically connected junction of the first doped regions and the gates, so that the first doped regions directly contact the corresponding gates;
a plurality of second doped regions of the first conductive type, wherein each of the second doped regions is disposed in the first doped regions between two adjacent gates respectively; and
a plurality of isolation structures, wherein each of the isolation structures is disposed in the substrate between two adjacent first doped regions respectively.

2. The semiconductor device according to claim 1, wherein the first doped regions are electrically connected to the different gates respectively.

3. The semiconductor device according to claim 1, wherein a depth of the isolation structures is deeper than a depth of the first doped regions.

4. The semiconductor device according to claim 1, wherein a doping concentration of the gates is higher than a doping concentration of the first doped regions.

5. The semiconductor device according to claim 1, further comprising a plurality of memory cells disposed on the substrate, wherein the memory cells are coupled to the second doped regions respectively.

6. The semiconductor device according to claim 5, further comprising a plurality of conductive plugs disposed between the memory cells and the second doped regions, so that the memory cells are electrically connected to the second doped regions through the conductive plugs.

7. The semiconductor device according to claim 5, further comprising a plurality of bit lines, wherein each of the bit lines is disposed on the memory cells between two adjacent gates respectively.

8. The semiconductor device according to claim 5, wherein the memory cells are resistive random access memory (RRAM) cells, phase change memory (PCM) cells, or magnetoresistive random access memory (MRAM) cells.

9. The semiconductor device according to claim 1, wherein when the first conductive type is P-type, the second conductive type is N-type; or when the first conductive type is N-type, the second conductive type is P-type.

* * * * *